United States Patent [19]
Kano

[11] Patent Number: 5,270,715
[45] Date of Patent: Dec. 14, 1993

[54] MULTICHANNEL D/A CONVERTER

[75] Inventor: Kenji Kano, Itami, Japan

[73] Assignee: Mitsubishi Denki Kabushiki Kaisha, Tokyo, Japan

[21] Appl. No.: 838,937

[22] Filed: Feb. 21, 1992

[30] Foreign Application Priority Data

Jun. 4, 1991 [JP] Japan .................. 3-132658

[51] Int. Cl.[5] ............................................ H03M 1/18
[52] U.S. Cl. ................................ 341/139; 341/144; 341/141
[58] Field of Search ..................... 341/139, 144, 141

[56] References Cited

U.S. PATENT DOCUMENTS 4,202,042  5/1980  Connors et al. ............... 341/144
5,089,820  2/1992  Gorai et al. ................... 341/139

Primary Examiner—Sharon D. Logan
Attorney, Agent, or Firm—Oblon, Spivak, McClelland, Maier & Neustadt

[57] ABSTRACT

There are provided $2^n$-number of data latches (2), $2^n$-number of dynamic range setting latches (7) and $2^n$-number of output dynamic range change circuits (8) in correspondence to $2^n$-number of D/A converters. Controlled by the outputs of AND gates (4), the respective dynamic range setting latches (7) output dynamic range setting data DR to the corresponding output dynamic range change circuits (8). The output dynamic range change circuits (8) change dynamic ranges for the analog outputs of the corresponding D/A converters (5) as a function of the dynamic range setting data DR to output the changed analog outputs from corresponding output terminals (26).

This enables the dynamic ranges for the plurality of D/A converters to be set individually without the provision of further external terminals.

9 Claims, 8 Drawing Sheets

FIG. 8
PRIOR ART

MULTICHANNEL D/A CONVERTER

BACKGROUND OF THE INVENTION

1. Field of the Invention

The present invention relates to a multichannel D/A converter including a plurality of D/A converters in a single chip.

2. Description of the Background Art

Recently, most electrical appliances such as TV, VTR and the like have been equipped with remote controllers. Various units in the electrical appliance are controlled by a microcomputer, based on a signal transmitted by the remote controller. Accordingly increased is the necessity of converting a digital signal which is the control signal of the microcomputer into an analog signal for practically controlling the various units in the electrical appliance. A large number of D/A converters have been required.

In a TV, for example, it is common that the microcomputer controls the volume, picture brightness, white balance and the like by means of the remote controller. For the control by the microcomputer, a single D/A converter is required for each of the units to be controlled. A multichannel D/A converter which includes a plurality of D/A converters integrated on a single semiconductor chip meets the aforesaid requirement.

Figure 7:
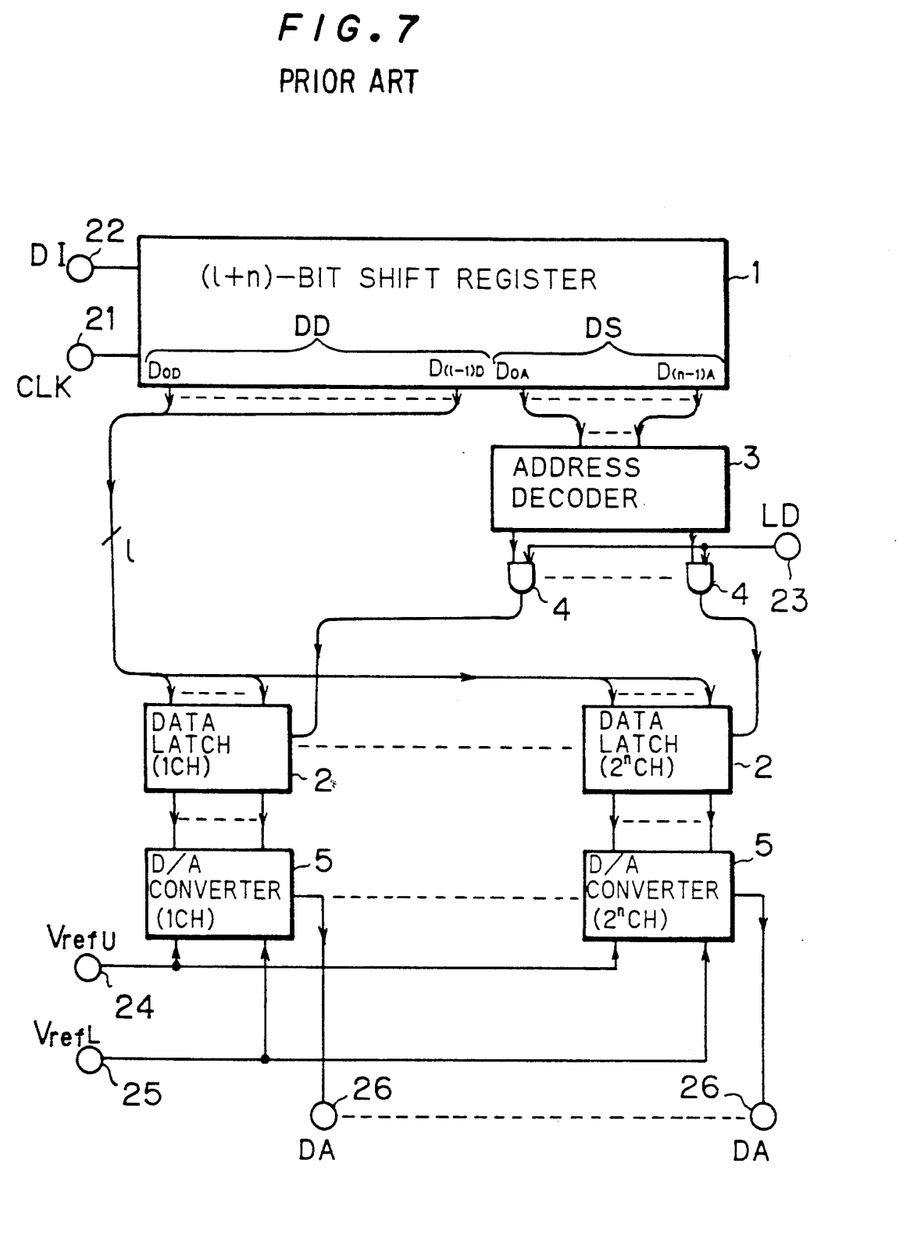
FIG. 7 illustrates a conventional multichannel D/A converter.

FIG. 7 illustrates a conventional multichannel D/A converter. The multichannel D/A converter comprises $2^n$-number of (1-CH (channel) to $2^n$-CH) D/A converters 5. There are provided $2^n$-number of data latches 2 in correspondence to the D/A converters 5.

An (l+n)-bit shift register 1 serially receives an input data DI from an input terminal 22 in synchronism with a clock CLK inputted from a clock terminal 21, and stores a digital data having a total of (l+n) bits. The digital data includes D/A conversion data $D_{OD}$ to $D_{(l-1)D}$ (generically referred to as "DD" hereinafter) of l bit and addressing data $D_{OA}$ to $D_{(n-1)A}$ (generically referred to as "DS" hereinafter) of n bits.

The $2^n$-number of (1-CH to $2^n$-CH) data latches 2 each of which can store l bit are connected in parallel in correspondence to the D/A conversion data DD of the shift register 1.

The addressing data DS of the shift register 1 is inputted to an address decoder 3. The address decoder 3 decodes the addressing data DS and sets one of $2^n$-number of output lines to "H". The $2^n$-number of output lines are connected to the first input portions of $2^n$-number of AND gates 4, respectively. A data load signal LD from a data load terminal 23 is applied to the second input portions of the $2^n$-number of AND gates 4 in common. The outputs of the AND gates 4 are applied to the 1-CH to $2^n$-CH data latches 2 respectively.

Controlled by the respective outputs of the AND gates 4, the data latches 2 receive the D/A conversion data DD of the shift register 1 in parallel and output the D/A conversion data DD to the corresponding D/A converters 5.

Figure 8:
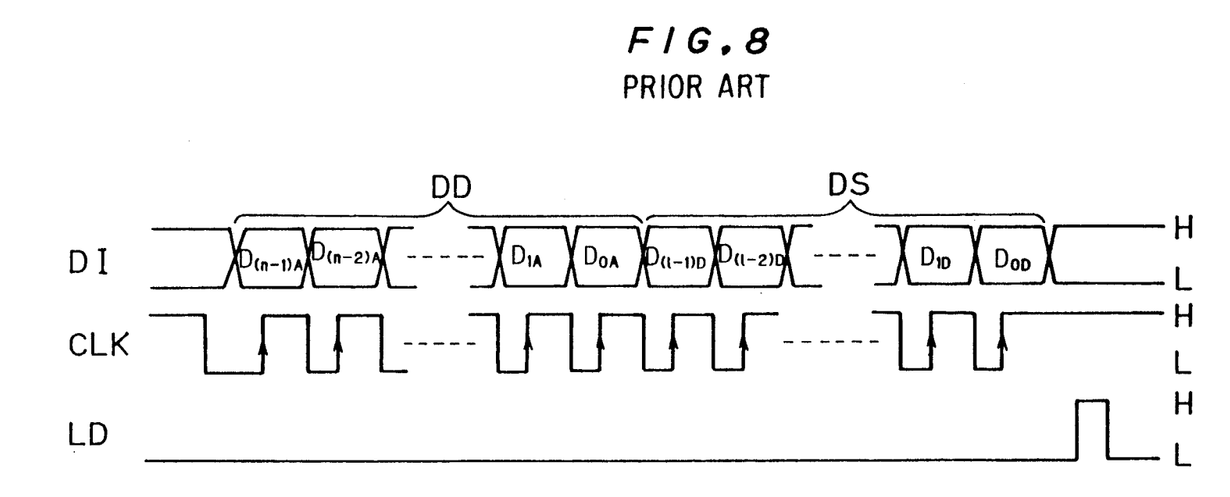
FIG. 8 is a waveform chart showing the input timings of the various signals in the multichannel D/A converter of FIG. 7.

FIG. 8 is a waveform chart showing the input timings of various signals in the multichannel D/A converter of FIG. 7.

In synchronism with the rising edge of the clock signal CLK, the input data DI is serially inputted to the shift register 1 in the form of the D/A conversion data DD or the addressing data DS. While the data load signal LD is at the "H" level, the D/A conversion data DD is latched by only the data latch 2 designated by the address decoder 3, that is, the data latch 2 connected to the output portion of the AND gate 4 having the first input portion associated with the output line at the "H" level of the address decoder 3.

Reference voltages $V_{refU}$ and $V_{refL}$ from reference voltage input terminals 24 and 25 are applied to the 1-CH to $2^n$-CH D/A converters 5 in common. The converters 5 perform D/A conversion on the D/A conversion data DD stored in the corresponding data latches 2 to output analog signals DA from corresponding data output terminals 26.

The conventional multichannel D/A converter formed on the single chip is structured as above mentioned. The D/A converters 5 of respective channels receive the reference voltages $V_{refU}$ and $V_{refL}$ from the reference voltage input terminals 24 and 25 in common. Hence, there has been a problem that dynamic ranges for the respective D/A converters 5 cannot be set individually.

For individually setting the dynamic ranges for the respective D/A converts 5, different reference voltages must be applied to the converters 5, so that it is necessary to provide the reference voltage input terminals for each of the D/A converters 5. A large number of external terminals are needed. This results in increased costs and a large packaging area for integration, as is not suitable for practical use.

SUMMARY OF THE INVENTION

The present invention is directed to a multichannel D/A converter which includes a plurality of D/A converters in a single chip. According to the present invention, the multichannel D/A converter comprises a data input terminal, a plurality of data output terminals corresponding to the plurality of D/A converters, a reference voltage setting terminal common to the plurality of D/A converters, a shift register serially receiving an external input data from the data input terminal for storing the data in the form of a D/A conversion data, a dynamic range setting data and an addressing data, D/A converter selection means for selecting one of the plurality of D/A converters as a function of the addressing data to make the selected D/A converter perform D/A conversion on the D/A conversion data, and dynamic range setting means for setting a dynamic range for an analog output of the selected D/A converter as a function of a reference voltage provided from the reference voltage setting terminal and the dynamic range setting data to output the analog output from one of the data output terminals which corresponds to the selected D/A converter.

According to the present invention, the dynamic range setting means sets the dynamic range for the analog output of the selected D/A converter as a function of the reference voltage provided from the reference voltage setting terminal and the dynamic range setting data applied in correspondence to each of the D/A converters, to output the analog output from the corresponding output terminal. Therefore, the individual dynamic range can be set in each of the D/A converters.

As a result, the external terminal required for setting the dynamic ranges for the respective D/A converters is only the reference voltage setting terminal common to the plurality of D/A converters and the data input terminal for serially inputting the D/A conversion data and the dynamic range setting data. Therefore, the individual dynamic ranges for the plurality of D/A converters can be set without increase in the number of external terminals.

An object of the present invention is to provide a multichannel D/A converter capable of setting individual dynamic ranges for a plurality of D/A converters without increase in the number of external terminals.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
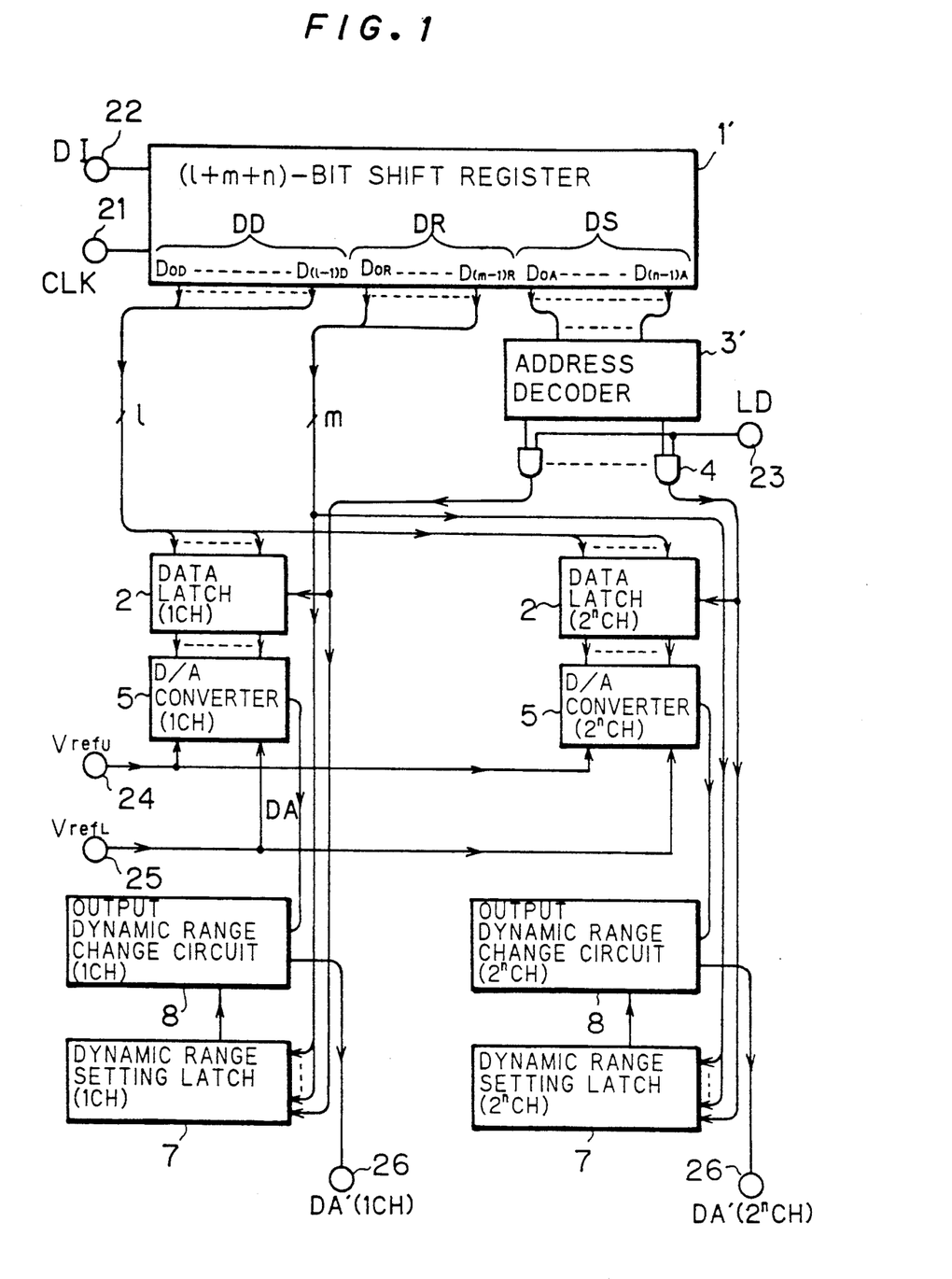
FIG. 1 illustrates a multichannel D/A converter according to a first preferred embodiment of the present invention.

FIG. 1 illustrates a multichannel D/A converter formed on a single chip according to a first preferred embodiment of the present invention. The multichannel D/A converter comprises $2^n$-number of (1-CH to $2^n$-CH) D/A converters 5. There are provided $2^n$-number of data latches 2, $2^n$-number of dynamic range setting latches 7 and $2^n$-number of output dynamic range change circuits 8 in correspondence to the D/A converters 5.

An (l+m+n)-bit shift register 1' serially receives an input data DI from an input terminal 22 in synchronism with a clock CLK inputted from a clock terminal 21, and stores a digital data having a total of (l+m+n) bits. The digital data includes D/A conversion data $D_{OD}$ to $D_{(l-1)D}$ (generically referred to as "DD" hereinafter) of l bits, addressing data $D_{OA}$ to $D_{(n-1)A}$ (generically referred to as "DS" hereinafter) of n bits, and dynamic range setting data $D_{OR}$ to $D_{(m-1)R}$ (generically referred to as "DR" hereinafter) of m bits.

The $2^n$-number of (1-CH to $2^n$-CH) data latches 2 each of which can store l bit are connected in parallel in correspondence to the D/A conversion data DD of the shift register 1'.

The addressing data DS of the shift register 1' is given to an address decoder 3'. The address decoder 3' decodes the addressing data DS and sets one of $2^n$-number of output lines to "H". The $2^n$-number of output lines are connected to the first input portions of $2^n$-number of AND gates 4. A data load signal LD from a data load terminal 23 is applied in common to the second input portions of the AND gates 4. The outputs of the AND gates 4 are applied to the 1-CH to $2^n$-CH data latches 2 and to the 1-CH to $2^n$-CH dynamic range setting latches 7.

Controlled by the respective outputs of the AND gates 4, the 1-CH to $2^n$-CH data latches 2 receive the D/A conversion data DD of the shift register 1' in parallel and output the D/A conversion data DD to the corresponding 1-CH to $2^n$-CH D/A converters 5.

Controlled by the respective outputs of the AND gates 4, the 1-CH to $2^n$-CH dynamic range setting latches 7 receive the dynamic range setting data DR of the shift register 1' in parallel and output the dynamic range setting data DR to the corresponding output dynamic range change circuits 8.

Based on the dynamic range setting data DR from the corresponding dynamic range setting latches 7, the output dynamic range change circuits 8 amplify, damp and level-shift the analog outputs of the corresponding D/A converters 5 to output the changed analog outputs from the corresponding output terminals 26.

Figure 2:
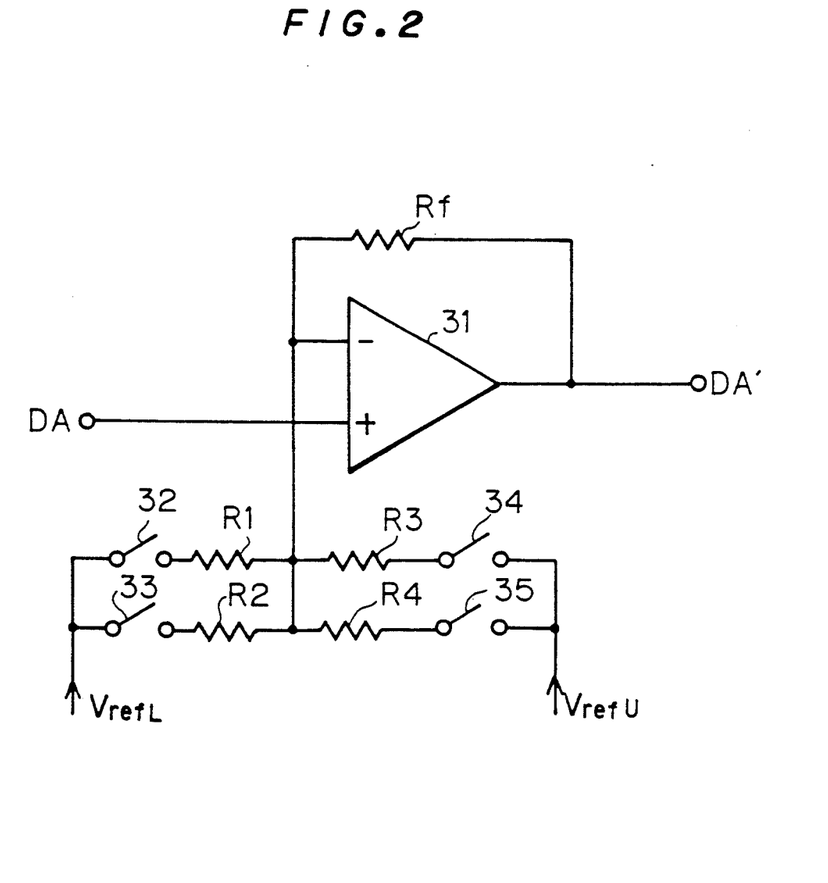
FIG. 2 is a circuit diagram of the details of an output dynamic range change circuit shown in FIG. 1.

FIG. 2 is a circuit diagram of the details of the output dynamic range change circuit 8. The analog output DA is inputted to the positive input portion of an operational amplifier 31. The output of the operational amplifier 31 is negatively fed back through a reference resistor Rf. One end of each resistor R1 to R4 is connected to the negative input portion of the operational amplifier 31. A reference voltage $V_{refL}$ is applied to the other ends of the resistors R1 and R2 through switches 32 and 33 respectively. A reference voltage $V_{refU}$ is applied to the other ends of the resistors R3 and R4 through switches 34 and 35 respectively. As is not shown, the resistance values of the resistors R1 and R3 vary depending on the dynamic range setting data DR. The output of the operational amplifier 31 is the changed analog output DA'.

When the switches 32 to 35 are OFF, tne changed analog output DA' is as follows:

$$DA' = DA \quad (1)$$

When the switches 32 and 34 are ON while the switches 33 and 35 are OFF, the changed analog output DA' is as follows:

$$DA' = \left( DA - \frac{R1 \cdot V_{refU} + R3 \cdot V_{refL}}{R1 + R3} \right) \cdot \left[ 1 + \frac{(R1 + R3) \cdot Rf}{R1 \cdot R3} \right] + \frac{R1 \cdot V_{refU} + R3 \cdot V_{refL}}{R1 + R3}$$

$$= DA \cdot \left[ 1 + \frac{(R1 + R3) \cdot Rf}{R1 \cdot R3} \right] - \frac{(R1 \cdot V_{refU} + R3 \cdot V_{refL})}{R1 \cdot R3} \quad (2)$$

When the analog output DA is equal to the minimum reference voltage $V_{refL}$, the formula (2) is expressed by:

$$DA' = V_{refL} + \frac{Rf \cdot (V_{refL} - V_{refU})}{R3} \quad (3)$$

When the analog output DA is equal to the maximum reference voltage $V_{refU}$, the formula (2) is expressed by:

$$DA' = V_{refU} + \frac{Rf \cdot (V_{refU} - V_{refL})}{R1} \quad (4)$$

That is, by changing the resistance values of the resistors R1 and R3 depending on the dynamic range setting data DR, the dynamic range of the analog output DA can be changed to obtain the changed analog output DA'.

Figure 3:
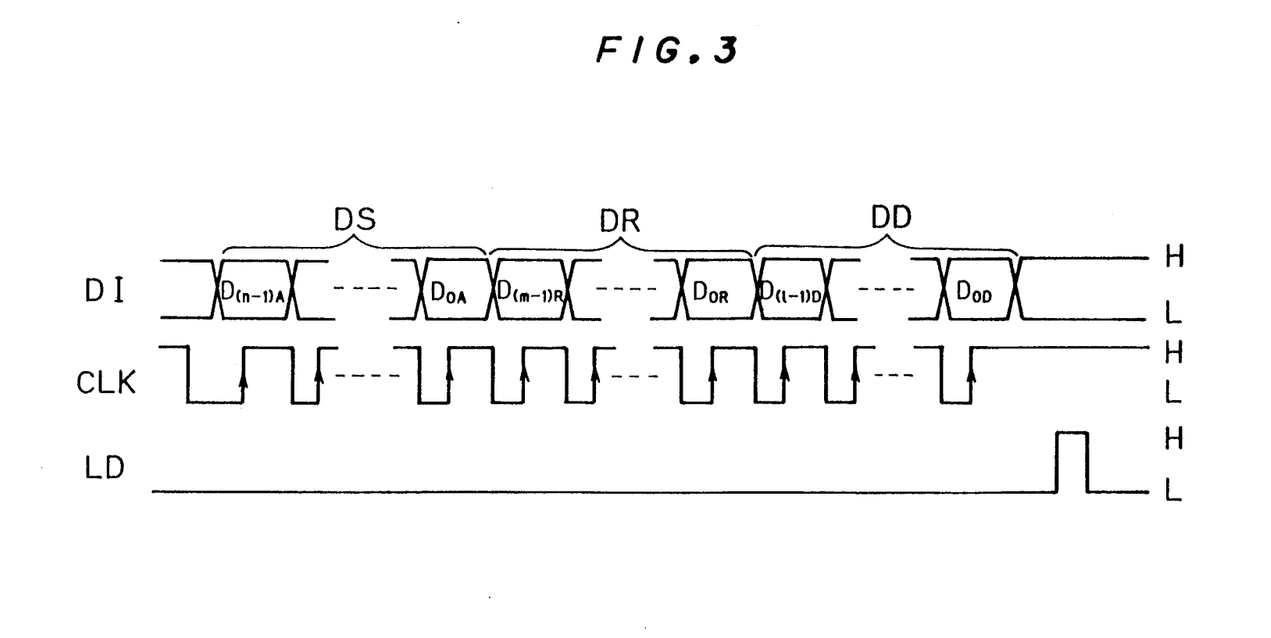
FIG. 3 is a waveform chart showing the input timings of various signals in the multichannel D/A converter of FIG. 1.

FIG. 3 is a waveform chart showing the input timings of various signals in the multichannel D/A converter of FIG. 1.

In synchronism with the rising edge of the clock signal CLK, the input data DI is serially inputted to the shift register 1' in the form of the D/A conversion data DD, the addressing data DS or the dynamic range setting data DR. While the data load signal LD is at the "H" level, the D/A conversion data DD and the dynamic range setting data DR are latched by only the data latch 2 and dynamic range setting latch 7 designated by the address decoder 3' respectively, that is, those connected to the output portion of the AND gate 4 having the first input portion associated with the output line at the "H" level of the address decoder 3'.

The reference voltages $V_{refU}$ and $V_{refL}$ from reference voltage input terminals 24 and 25 are applied to the 1-CH to $2^n$-CH D/A converters 5 in common. The D/A converters 5 perform D/A conversion on the D/A conversion data DD stored in the corresponding data latches 2 to output the analog outputs DA to the corresponding output dynamic range change circuits 8.

The output dynamic range change circuits 8 change the dynamic ranges of the analog outputs DA, so that the changed analog outputs DA' are outputted from the corresponding output terminals 26.

As described above, the dynamic range setting latches 7 and output dynamic range change circuits 8 corresponding to the respective D/A converters 5 are provided in the first preferred embodiment. The shift register 1' can store the dynamic range setting data DR. This provides for the change in the dynamic range for the analog output DA of each of the D/A converters 5 depending on the dynamic range setting data DR serially given from the outside to output the changed analog output DA' through each of the output terminal 26.

As a result, the individual dynamic ranges for the analog outputs of the D/A converters 5 of every channel can be set without the provision of an external terminal for setting the dynamic range for each of the D/A converters.

Figure 4:
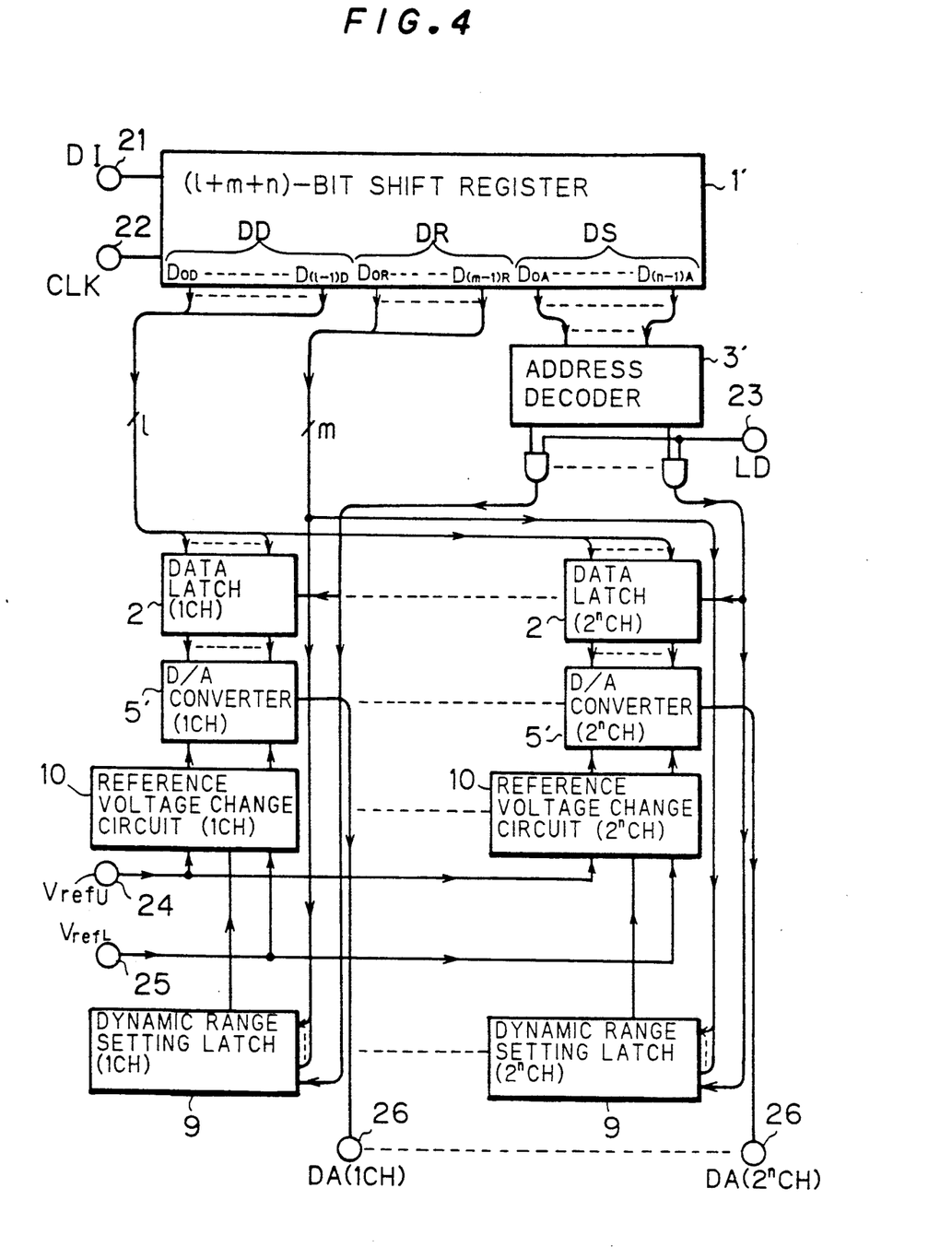
FIG. 4 illustrates the multichannel D/A converter according to a second preferred embodiment of the present invention.

FIG. 4 illustrates the multichannel D/A converter formed on the single chip according to a second preferred embodiment of the present invention. The multichannel D/A converter comprises $2^n$-number of (1-CH to $2^n$-CH) D/A converters 5'. There are provided $2^n$-number of data latches 2, $2^n$-number of dynamic range setting latches 9 and $2^n$-number of reference voltage change circuits 10 in correspondence to the D/A converters 5.

In synchronism with the clock CLK inputted from the clock terminal 21, the (l+m+n)-bit shift register 1' serially receives the input data DI from the input terminal 22 and stores the digital data having a total of (l+m+n) bits. The digital data includes the D/A conversion data DD of l bit, the addressing data DS of n bits and the dynamic range setting data DR of m bits.

The $2^n$-number of data latches 2 each of which can store 1 bit are connected in parallel in correspondence to the D/A conversion data DD of the shift register 1'.

The addressing data DS of the shift register 1' is inputted to the address decoder 3'. The address decoder 3' decodes the addressing data DS and sets one of the $2^n$-number of output lines to "H". The $2^n$-number of output lines are connected to the first input portions of the AND gates 4, respectively. The data load signal LD given from the data load terminal 23 is inputted to the second input portions of the $2^n$-number of AND gates 4. The outputs of the AND gates 4 are applied to the 1-CH to $2^n$-CH data latches 2 and to the 1-CH to $2^n$-CH dynamic range setting latches 9, respectively.

Controlled by the respective outputs of the AND gates 4, the 1-CH to $2^n$-CH data latches 2 receives the D/A conversion data DD of the shift register 1' in parallel and output the D/A conversion data DD to the corresponding 1-CH to $2^n$-CH D/A converters 5'.

Controlled by the respective outputs of the AND gates 4, the 1-CH to $2^n$-CH dynamic range setting latches 9 receive the dynamic range setting data DR of the shift register 1' in parallel and output the dynamic range setting data DR to the corresponding reference voltage change circuits 10.

The reference voltages $V_{refU}$ and $V_{refL}$ from the reference voltage input terminals 24 and 25 are applied to the reference voltage change circuits 10. Based on the dynamic range setting data DR provided from the corresponding dynamic range setting latches 9, the reference voltage change circuits 10 change the levels of the reference voltages $V_{refU}$ and $V_{refL}$ to apply changed reference voltages $V_{refU}'$ and $V_{refL}'$ to the corresponding D/A converters 5'.

Figure 5:
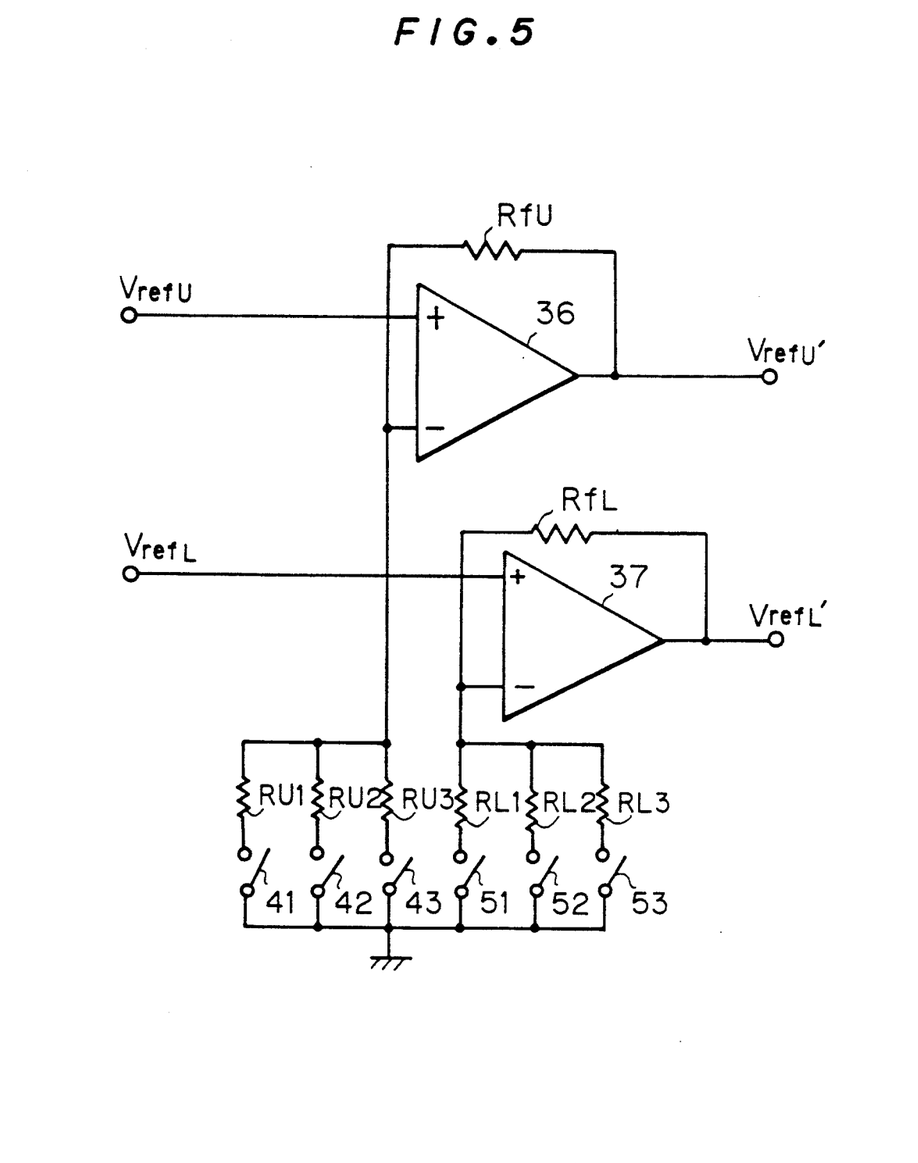
FIG. 5 is a circuit diagram of the details of a reference voltage change circuit shown in FIG. 4.

FIG. 5 is a circuit diagram of the details of the reference voltage change circuit 10. The reference voltage $V_{refU}$ is applied to the positive input portion of an operational amplifier 36. The output of the operational amplifier 36 is negatively fed back through a reference resistor RfU. Resistors RU1 to RU3 are connected in parallel to the negative input portion of the operational amplifier 36 and are grounded through switches 41 to 43 respectively. The output of the operational amplifier 36 is the changed reference voltage $V_{refU}'$.

The reference voltage $V_{refL}$ is applied to the positive input portion of an operational amplifier 37. The output of the operational amplifier 37 is negatively fed back through a reference resistor RfL. Resistors RL1 to RL3 are connected in parallel to the negative input portion of the operational amplifier 37 and are grounded through switches 51 to 53 respectively. The output of the operational amplifier 37 is the changed reference voltages $V_{refL}'$.

When any of the switches 41 to 43 is turned on and any of the switches 51 to 53 is turned on, the reference voltages $V_{refU}$ and $V_{refL}$ can be changed to provide the changed reference voltages $V_{refU}'$ and $V_{refL}'$.

For example, when only the switches 41 and 51 are ON, the changed reference voltages $V_{refU}'$ and $V_{refL}'$ are as follows:

$$V_{refU}' = \left(1 + \frac{RfU}{RU1}\right) \cdot V_{refU} \quad (5)$$

$$V_{refL}' = \left(1 + \frac{R/U}{RL1}\right) \cdot V_{refL}$$

When the switches 42 and 52 are ON, they are as follows:

$$V_{refU}' = \left(1 + \frac{R/U}{RU2}\right) \cdot V_{refU} \quad (6)$$

$$V_{refL}' = \left(1 + \frac{R/U}{RL2}\right) \cdot V_{refL}$$

When the switches 43 and 53 are ON, they are as follows:

$$V_{refU}' = \left(1 + \frac{R/U}{RU3}\right) \cdot V_{refU} \quad (7)$$

$$V_{refL}' = \left(1 + \frac{R/U}{RL3}\right) \cdot V_{refL}$$

The D/A converters 5' perform D/A conversion on the D/A conversion data DD stored in the corresponding data latches 2 in the dynamic ranges based on the reference voltages $V_{refU}'$ and $V_{refL}'$ provided from the corresponding reference voltage change circuits 10, to output the converted analog outputs DA from the corresponding external terminals 26.

Figure 6:
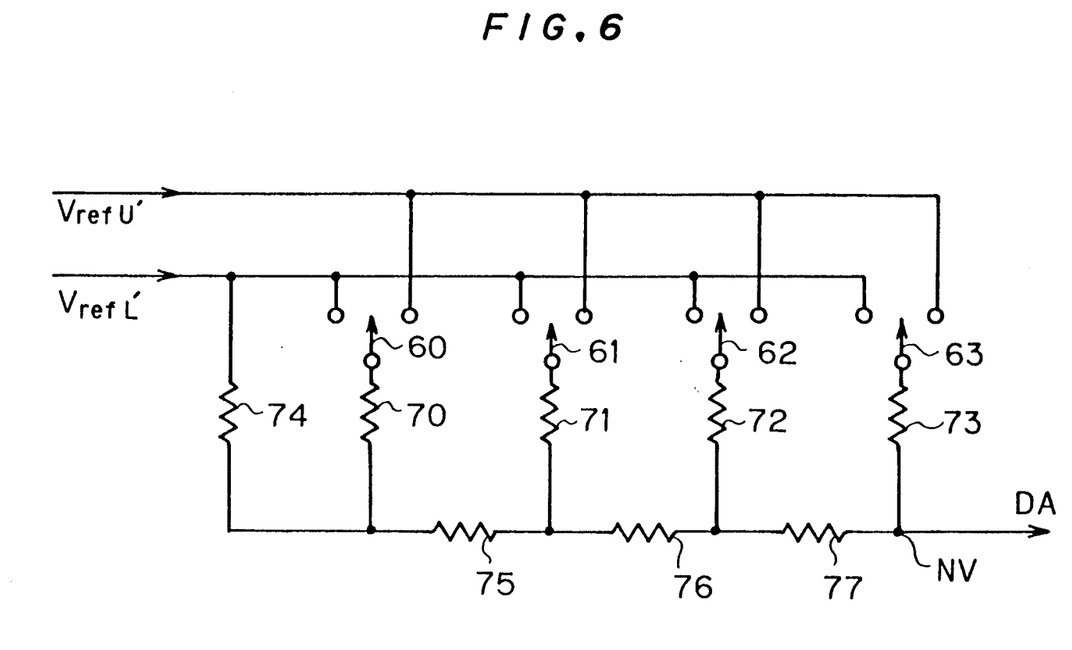
FIG. 6 is a circuit diagram of the details of a D/A converter shown in FIG. 4.

FIG. 6 is a circuit diagram of the details of an example of the D/A converters 5' shown in FIG. 4. The reference voltage $V_{refU}'$ is applied to resistors 70 to 73 each having the resistance value of 2R through switches 60 to 63. The reference voltage $V_{refL}'$ is applied directly to a resistor 74 having the resistance value of 2R and is also applied to the resistors 70 to 73 through the switches 60 to 63. Resistors 75 to 77 each having the resistance value of R are connected between the resistors 70 and 71, between the resistors 71 and 72, and between the resistors 72 and 73, respectively. The potential provided from an output node NV between the resistors 73 and 77 is the analog output DA.

The switches 60 and 63 are switched to the side of the reference voltage $V_{refU}'$ (or $V_{refL}'$) based on the value 1 (or 0) of digital bit data b0 to b3 in the D/A conversion data.

In this structure, the analog output DA is as follows:

$$DA = \frac{(V_{refU}' - V_{refL}')}{2^4} \cdot \quad (8)$$

$$(2^3 \cdot b3 + 2^2 \cdot b2 + 2^1 \cdot b1 + 2^0 \cdot b0) + V_{refL}'$$

Thus, the D/A converter 5' of FIG. 6 outputs the analog output DA in the dynamic range based on the changed reference voltages $V_{refU}'$ and $V_{refL}'$.

The dynamic range setting latches 7 and reference voltage change circuits 10 corresponding to the respective D/A converters 5' are provided in the second preferred embodiment. The shift register 1' can store the dynamic range setting data DR. Based on the dynamic range setting data DR provided from the outside, the changed reference voltages $V_{refU}'$ and $V_{refL}'$ applied to the respective D/A converters 5' can be set individually. This enables the respective D/A converters 5' to output the individual analog outputs DA through the output terminals 26.

As a result, the individual dynamic ranges for the analog outputs of the D/A converters 5 of every channel can be set without the provision of an external terminal for setting the dynamic range.

While the invention has been shown and described in detail, the foregoing description is in all aspects illustrative and not restrictive. It is therefore understood that numerous modifications and variations can be devised without departing from the scope of the invention.

I claim:

1. A multichannel D/A converter which includes a plurality of D/A converters in a single chip, comprising
    a data input terminal,
    a plurality of data output terminals corresponding to said plurality of D/A converters,
    a reference voltage setting terminal common to said plurality of D/A converters,
    a shift register serially receiving an external input data from said data input terminal for storing the data in the form of a D/A conversion data, a dynamic range setting data and an addressing data,
    D/A converter selection means for selecting one of said plurality of D/A converters as a function of said addressing data to make said selected D/A converter perform D/A conversion on said D/A conversion data, and
    dynamic range setting means for setting a dynamic range for an analog output of said selected D/A converter as a function of a reference voltage provided from said reference voltage setting terminal and said dynamic range setting data to output said analog output from one of said data output terminals which corresponds to said selected D/A converter.

2. A multichannel D/A converter which includes a plurality of D/A converters in a single chip, comprising
    a data input terminal,
    a plurality of data output terminals corresponding to said plurality of D/A converters,
    a reference voltage setting terminal common to said plurality of D/A converters,
    a shift register serially receiving an external input data from said data input terminal for storing the data in the form of a D/A conversion data, a dynamic range setting data and an addressing data,
    D/A converter selection means for selecting one of said plurality of D/A converters as a function of said addressing data to make said selected D/A converter perform D/A conversion on said D/A conversion data and output an analog output in a dynamic range based on a reference voltage provided from said reference voltage setting terminal, and
    dynamic range setting means corresponding to said plurality of D/A converters, one of said dynamic range setting means which corresponds to said selected D/A converter changing the dynamic range for the analog output of said selected D/A converter as a function of said dynamic range setting data to output a changed analog output from one of said data output terminals which corresponds to said selected D/A converter.

3. A multichannel D/A converter in accordance with claim 2, wherein said D/A converter selection means includes
- a plurality of data latches corresponding to said plurality of D/A converters, each for storing data serving as said D/A conversion data of corresponding said D/A converter, and
- data latch selection means for selecting one of said plurality of data latches as a function of said addressing data to make said selected data latch store said D/A conversion data.

4. A multichannel D/A converter in accordance with claim 3, wherein said dynamic range setting means include
- a plurality of dynamic range setting latches corresponding to said plurality of D/A converters,
- dynamic range setting latch selection means for selecting one of said plurality of dynamic range setting latches as a function of said addressing data to make said selected dynamic range setting latch store said dynamic range setting data, and
- analog output change means corresponding to said plurality of dynamic range setting latches, respectively, each for changing level of the analog output of corresponding said D/A converter to output the changed analog output from corresponding said data output terminal as a function of data stored in corresponding said dynamic range setting latch.

5. A multichannel D/A converter in accordance with claim 4, wherein said data latch selection means and said dynamic range setting latch selection means are formed as the same circuit.

6. A multichannel D/A converter which includes a plurality of D/A converters in a single chip, comprising
- a data input terminal,
- data output terminals corresponding to said plurality of D/A converters, each for outputting analog output of corresponding said D/A converters,
- a reference voltage setting terminal common to said plurality of D/A converters,
- a shift register serially receiving an external input data from said data input terminal for storing the data in the form of a D/A conversion data, a dynamic range setting data and an addressing data,
- D/A converter selection means for selecting one of said plurality of D/A converters as a function of said addressing data to make said selected D/A converter perform D/A conversion on said D/A conversion data and output the analog output, and
- dynamic range setting means corresponding to said plurality of D/A converters, respectively, one of said dynamic range setting means which corresponds to said selected D/A converter changing a reference voltage provided from said reference voltage setting terminal as a function of said dynamic range setting data and applying a changed reference voltage to said selected D/A converter to set a dynamic range for the analog output of said selected D/A converter.

7. A multichannel D/A converter in accordance with claim 6, wherein said D/A converter selection means includes
- a plurality of data latches corresponding to said plurality of D/A converters, each for storing data serving as said D/A conversion data of corresponding said D/A converter, and
- data latch selection means for selecting one of said plurality of data latches as a function of said addressing data to make said selected data latch store said D/A conversion data.

8. A multichannel D/A converter in accordance with claim 7, wherein said dynamic range setting means include
- a plurality of dynamic range setting latches corresponding to said plurality of D/A converters,
- dynamic range setting latch selection means for selecting one of said plurality of dynamic range setting latches as a function of said addressing data to make said selected dynamic range setting latch store said dynamic range setting data, and
- reference voltage change means corresponding to said plurality of dynamic range setting latches, respectively, each for changing said reference voltage provided from said reference voltage setting terminal as a function of data stored in corresponding said dynamic range setting latch and applying the changed reference voltage to corresponding said D/A converter to set the dynamic range for the analog output of said selected D/A converter.

9. A multichannel D/A converter in accordance with claim 8, wherein said data latch selection means and said dynamic range setting latch selection means are formed as the same circuit.

* * * * *